(12) United States Patent
Corona et al.

(10) Patent No.: US 8,344,466 B2
(45) Date of Patent: Jan. 1, 2013

(54) PROCESS FOR MANUFACTURING MEMS DEVICES HAVING BURIED CAVITIES AND MEMS DEVICE OBTAINED THEREBY

(75) Inventors: Pietro Corona, Milan (IT); Stefano Losa, Cornaredo (IT); Ilaria Gelmi, Milan (IT); Roberto Campedelli, Novate Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 175 days.

(21) Appl. No.: 12/850,548

(22) Filed: Aug. 4, 2010

(65) Prior Publication Data
US 2011/0031567 A1    Feb. 10, 2011

(30) Foreign Application Priority Data
Aug. 5, 2009    (IT) .............................. TO2009A0616

(51) Int. Cl.
*H01L 29/84* (2006.01)
*H01L 21/02* (2006.01)
(52) U.S. Cl. . 257/417; 257/419; 257/618; 257/E29.324; 257/E21.002; 438/50; 438/53
(58) Field of Classification Search .......... 257/417–419, 257/618, E29.324, E21.002; 438/50, 53
See application file for complete search history.

(56) References Cited

U.S. PATENT DOCUMENTS

| | | | |
|---|---|---|---|
| 6,012,336 A | 1/2000 | Eaton et al. | |
| 6,478,974 B1 * | 11/2002 | Lebouitz et al. | 216/2 |
| 6,521,965 B1 | 2/2003 | Lutz | |
| 6,527,961 B1 | 3/2003 | Vigna et al. | |
| 6,936,902 B2 | 8/2005 | Reichenbach et al. | |
| 2005/0230708 A1 * | 10/2005 | Reichenbach et al. | 257/200 |
| 2010/0074458 A1 * | 3/2010 | Lan et al. | 381/150 |
| 2011/0267212 A1 * | 11/2011 | Denison | 341/122 |

FOREIGN PATENT DOCUMENTS
WO    97/49475 A1    12/1997

OTHER PUBLICATIONS

Dougherty, G. et al., "Microfabrication Using One-Step LPCVD Porous Polysilicon Films," Journal of Microelectromechanical Systems 12(4):418-424, Aug. 2003.

(Continued)

*Primary Examiner* — Tuan N. Quach
(74) *Attorney, Agent, or Firm* — Seed IP Law Group PLLC

(57) ABSTRACT

A process for manufacturing a MEMS device, wherein a bottom silicon region is formed on a substrate and on an insulating layer; a sacrificial region of dielectric is formed on the bottom region; a membrane region, of semiconductor material, is epitaxially grown on the sacrificial region; the membrane region is dug down to the sacrificial region so as to form through apertures; the side wall and the bottom of the apertures are completely coated in a conformal way with a porous material layer; at least one portion of the sacrificial region is selectively removed through the porous material layer and forms a cavity; and the apertures are filled with filling material so as to form a monolithic membrane suspended above the cavity. Other embodiments are directed to MEMS devices and pressure sensors.

20 Claims, 6 Drawing Sheets

OTHER PUBLICATIONS

He, R. et al., "On-Wafer Monolithic Encapsulation by Surface Micromachining With Porous Polysilicon Shell," Journal of Microelectromechanical Systems 16(2):462-472, Apr. 2007.

He, R. et al., "Low-Temperature Monolithic Encapsulation Using Porous-Alumina Shell Anodized on Chip," Journal of Microelectromechanical Systems 18(3):588-596, Jun. 2009.

Verheijden, G.J.A.M. et al., "Wafer Level Encapsulation Technology for MEMS Devices Using an HF-Permeable PECVD SIOC Capping Layer," IEEE 21st International Conference on Micro Electro Mechanical Systems, Tucson, AZ, Jan. 13-17, 2008, pp. 798-801.

* cited by examiner

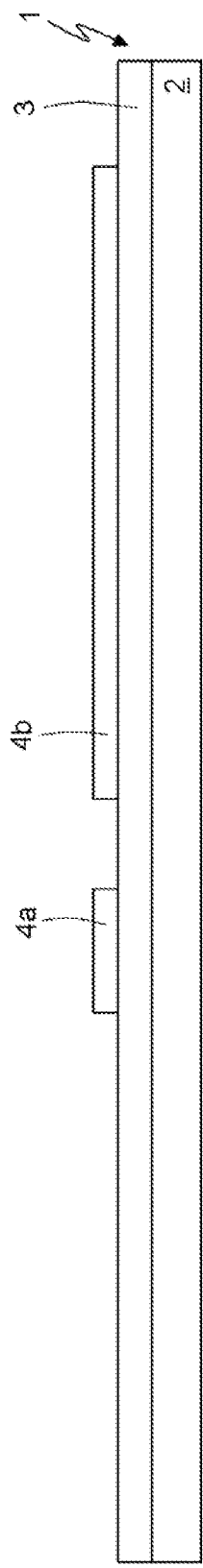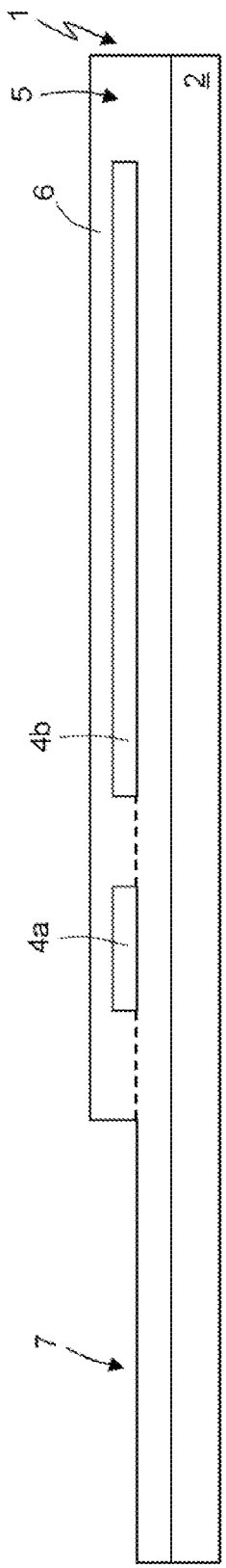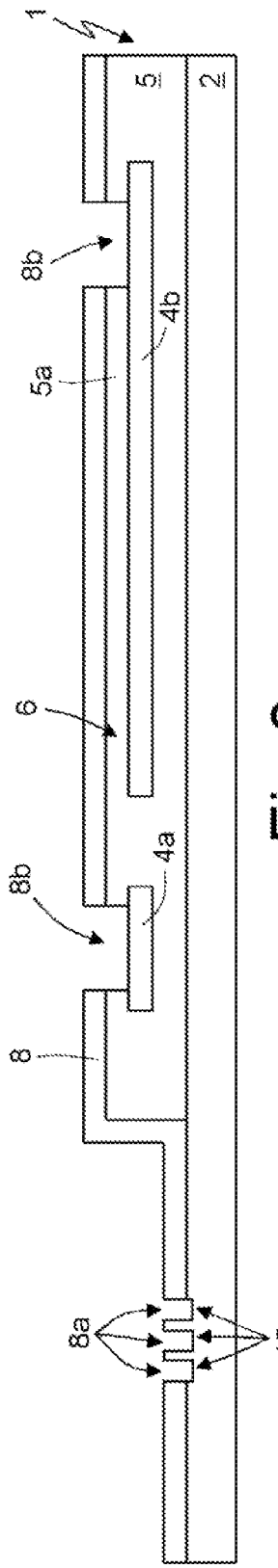
Fig.1
Fig.2
Fig.3

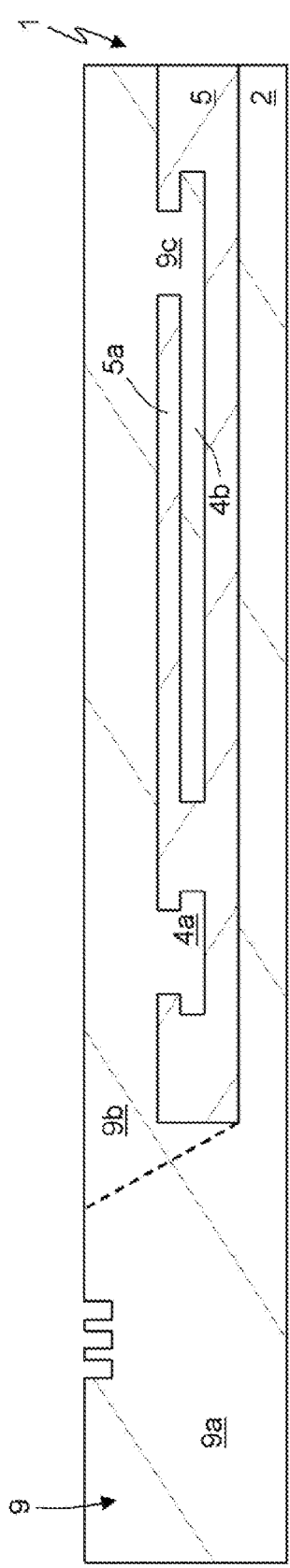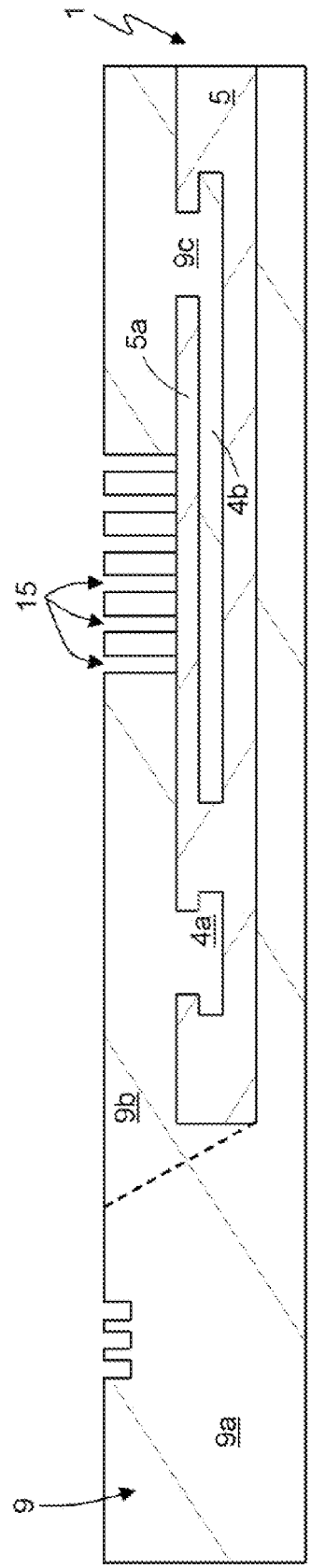
Fig.4
Fig.5

PROCESS FOR MANUFACTURING MEMS DEVICES HAVING BURIED CAVITIES AND MEMS DEVICE OBTAINED THEREBY

BACKGROUND

1. Technical Field

The present disclosure relates to a process for manufacturing MEMS devices. In particular, the disclosure relates to the manufacture of devices having a membrane suspended above buried cavities or channels.

2. Description of the Related Art

Hereinafter, reference will be made to the manufacture of a capacitive pressure sensor having a suspended region, also referred to as membrane, that is able to move with respect to the rest of the structure.

The disclosure is not, however, limited to this sensor, but applies also to other MEMS sensors, actuators and devices having buried channels, for instance for the use in microfluidic devices.

In particular, in the case of pressure sensors of a capacitive type, the membrane represents a variable electrode, facing a fixed portion forming a fixed electrode and separated from the latter by a buried cavity.

Various techniques are known for manufacturing the membrane, based upon gluing two substrates or removing a sacrificial layer.

For example, U.S. Pat. No. 7,273,764 describes a manufacturing process, carried out starting from a wafer made up of a silicon substrate, an insulating layer and a deposited polysilicon layer, wherein initially trenches are formed in the polysilicon layer, part of the insulating layer is removed through the trenches so as to form a cavity, the cavity and the trenches are filled with porous oxide, a covering region of porous silicon is formed on the planarized surface of the wafer, the porous oxide is removed through the covering region, and a sealing region is formed on the covering region. This process is thus rather complex on account of the operations of filling and emptying the cavity and the trenches. In addition, the resulting membrane (polysilicon layer over the cavity) is perforated and thus fragile.

In other solutions, after forming etching holes in the membrane layer and removing the sacrificial material, the holes are filled. For instance, U.S. Pat. No. 6,521,965 envisages providing the bottom electrode; forming a sacrificial region on the bottom electrode; epitaxially growing the membrane layer; forming etching holes in the membrane layer; removing the sacrificial region through the etching holes; and closing the holes with filler oxide. A similar process is described also in U.S. Pat. No. 6,527,961 to obtain pressure sensors. U.S. Pat. No. 6,012,336 uses silicon nitride or metal for filling the etching holes.

In the above processes, filling the etching holes is a critical step. In fact, it is generally not possible to use a conformal material, otherwise this would penetrate into the cavity just obtained and would bring about at least partial filling thereof, with consequent false capacitive coupling. On the other hand, the use of a non-conformal material, given also the geometrical characteristics of the holes, which are narrow and deep for the applications where a membrane of large thickness is required, does not generally enable complete closing thereof. In fact, normally the etching holes are closed near the top opening before the filling material has completely filled the holes in the bottom part.

Also the use of two different materials, a first, non-conformal, material, which restricts the top opening and prevents a second, conformal, material from penetrating into the cavity, does not solve the problem. In addition, frequently, the aim is to achieve a low pressure within the cavity, and thus for filling of the etching holes it is not possible to use materials, such as oxides, deposited at atmospheric pressure. The use of different materials is moreover not optimal since thermal or mechanical stresses can arise that worsen the electrical characteristics and duration characteristics of the finished device. The provision of thin membranes is moreover disadvantageous in the case of pressure sensors, since the thickness of the membrane is important for obtaining a more linear behavior and a higher accuracy.

BRIEF SUMMARY

Some embodiments of the disclosure provide a process and a device that overcome the drawbacks of the prior art.

One embodiment, a process for manufacturing a MEMS device, comprises: forming a bottom region of a first material; forming a sacrificial region on the bottom region, of a second material different from the first material; epitaxially growing a membrane region, of semiconductor material, on the sacrificial region; forming a plurality of apertures in the membrane region down to the sacrificial region so as to form apertures each having a side wall delimited by the membrane region and a bottom delimited by the sacrificial region; completely and conformally coating the side wall and the bottom of the apertures with a porous material layer; selectively removing at least one portion of the sacrificial region through the porous material layer to form a cavity; and filling the apertures with filling material.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIGS. 1-5 show cross-sections of a wafer of semiconductor material, in successive steps of the present process;

DETAILED DESCRIPTION

Figure 8:
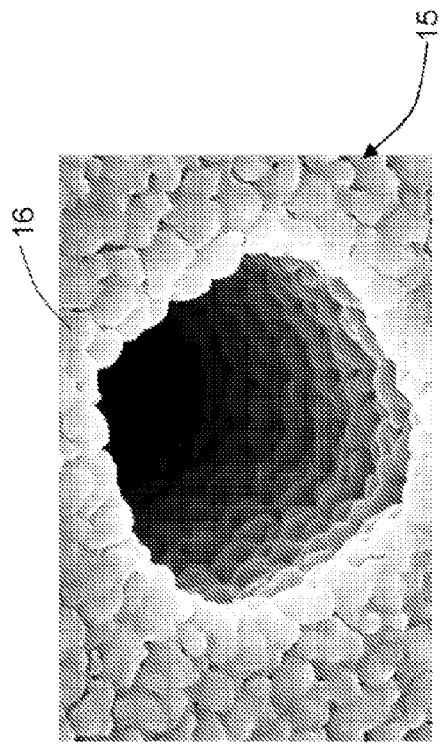
FIG. 8 shows, in perspective, a SEM image of a detail of the wafer of FIG. 7.

In the following description, numerous specific details are given to provide a thorough understanding of embodiments. The embodiments can be practiced without one or more of the specific details, or with other methods, components, materials, etc. In other instances, well-known structures, materials, or operations, for example; mask, are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" "according to an embodiment" or "in an embodiment" and similar phrases in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

FIG. 1 shows a wafer 1 comprising a substrate 2 of semiconductor material, typically silicon, overlaid by an insulating layer 3, for example silicon oxide having a thickness of 2.2 to 3 µm, typically 2.6 µm. Bottom regions 4a, 4b, for instance polysilicon regions, extend on the insulating layer 3 and are obtained by depositing and shaping a polycrystalline silicon layer having a thickness, for example, of 0.5-1.3 µm, typically 0.9 µm.

Next (FIG. 2), a sacrificial layer 6 of insulating material is deposited, for instance TEOS (tetraethylorthosilicate), which, together with the insulating layer 3, forms a dielectric layer 5 having a total thickness of for example 3.6-5.2 µm, typically 4.4 µm. The dielectric layer 5 is then selectively removed throughout its thickness in some areas, for instance on the lateral area 7 (shown on the left in FIG. 2).

Then (FIG. 3), an anchorage mask 8 is provided, for example a resist mask, having openings 8a on the lateral area 7, where alignment marks are to be made, and openings 8b on top of a portion of the dielectric layer 5, over the bottom regions 4a, 4b, where anchorages for the epitaxial growth are to be made. Using the anchorage mask 8, a silicon etch is made, to provide alignment marks 10 in the substrate 2, and an oxide etch, to remove selective portions of the sacrificial layer 6 and selectively expose the bottom regions 4a, 4b. The etch leaves behind a portion 5a of the dielectric layer 5 on the bottom region 4b, forming a sacrificial portion, as explained in greater detail hereinafter.

After removing the anchorage mask 8 (FIG. 4), an epitaxial growth is carried out starting from the exposed portions of the substrate 2 and of the bottom regions 4a, 4b, as well as a planarization of the wafer 1 thus obtained. In this way, a pseudo-epitaxial layer 9 grows, which comprises a monocrystalline region 9a, on the lateral area 7 and in general on top of the exposed areas of the substrate 2, and a polycrystalline region 9b, on the dielectric layer 5. In particular, the polycrystalline region 9b is in electrical contact with the bottom region 4b at an anchorage region 9c so as to enable electrical connection thereof, as explained in more detail hereinafter. The epitaxial growth is performed according to the desired thickness on the dielectric layer 5; typically, to obtain a pressure sensor, the polycrystalline region 9b can have, in the considered area, a thickness of 5 µm to 20 µm, for instance 6 µm.

Figure 6:
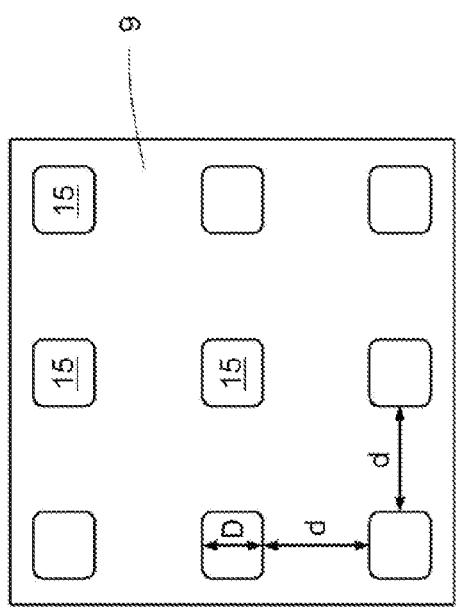
FIG. 6 shows an enlarged top view of a detail of the wafer of FIG. 5.

Then (FIG. 5), using a resist mask (not illustrated), an anisotropic etch of the polycrystalline region 9b is carried out, on top of the sacrificial portion 5a, so as to create apertures 15. The etch is interrupted automatically by the dielectric layer 5 so that the apertures 15 are through holes and traverse the entire thickness of the polycrystalline region 9b in the considered area. The apertures 15 can have a circular or square cross-section, or a square cross-section with rounded edges, or any polygonal shape. The apertures 15 are formed so as to have a transverse area much smaller than their depth and are arranged according to a grid that determines the shape of the desired membrane and/or cavity. Illustrated, for example, in FIG. 6 is part of a square grid, having sides of 100 to 1000 µm, where the apertures 15 are set at a uniform distance apart along both the Cartesian axes. Here the each of the apertures 15 have a square shape with rounded edges, with side D of 0.8 µm to 1.2 µm, typically 1 µm, and are set at a distance apart d=1.8-2.2 µm, typically 2 µm. In the case referred to above, where the polycrystalline region 9b has a thickness of 6 µm in the considered area, the apertures 15 have a diameter/depth ratio of approximately 1:6. In general, the apertures 15 can have a width/depth ratio of 1:5 to 1:20.

Figure 7:
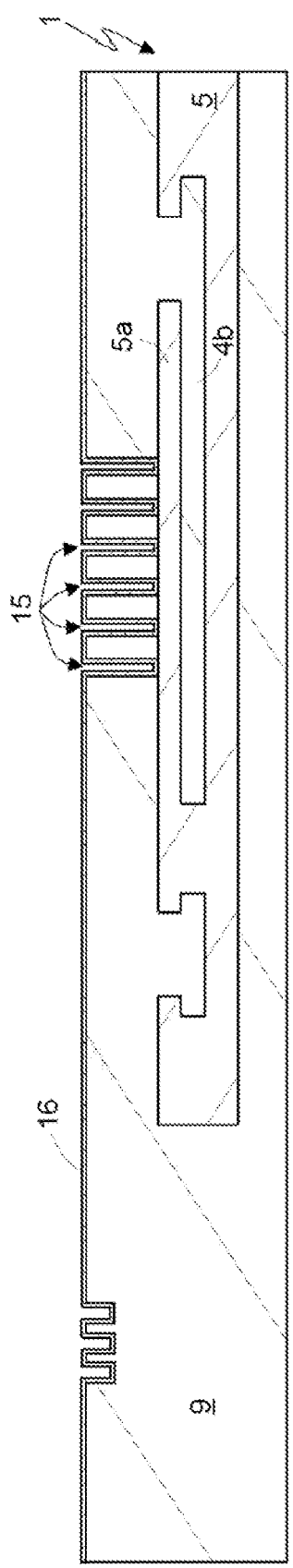
FIG. 7 shows a cross-section of the wafer of FIG. 5, in a subsequent step of the present process.

Next (FIG. 7), using a standard LCVD technique, a coating layer 16 of porous silicon, having for instance a thickness of 50-150 nm, typically 100 nm, is deposited. Since the coating layer 16 can be deposited in a conformal way and thanks to the presence of the sacrificial portion 5a that delimits extension thereof at the bottom, it coats completely not only the surface of the wafer 1 but also the vertical walls and the bottom of the apertures 15, as may be seen partially in the enlarged image of one of the apertures 15 taken with a scanning electron microscope (SEM) of FIG. 8.

Figure 9:
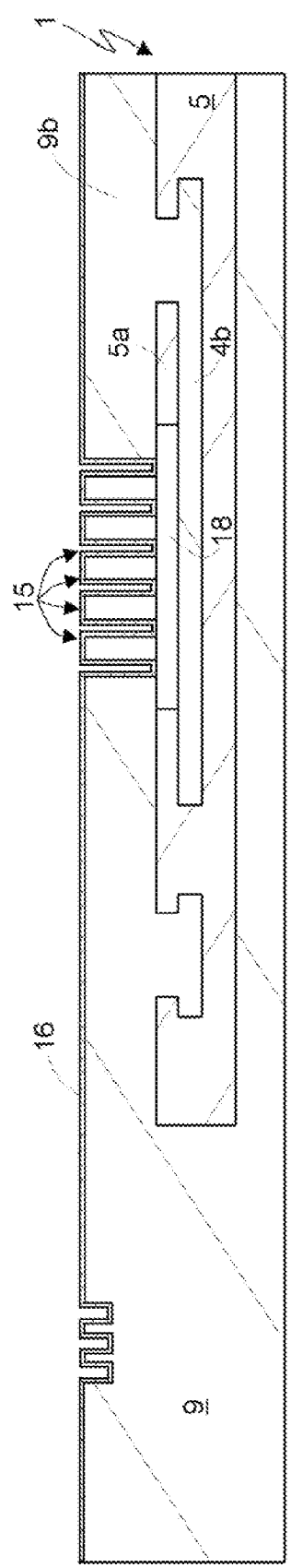
FIGS. 9 and 10 show cross-sections of the wafer of FIG. 7, in successive steps of the present process.

Due to the permeability of the coating layer 16 with regard to both the etching agent and to the reaction products, the part of the sacrificial portion 5a of the dielectric layer 5 underlying the grid of apertures 15 is removed via dry or wet etching, e.g., with anhydrous or aqueous hydrofluoric acid. A cavity 18 is thus created underneath the grid of apertures 15, as illustrated in FIG. 9.

Figure 11:
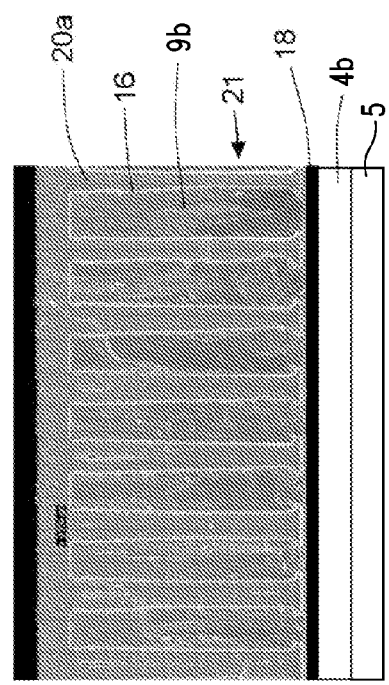
FIG. 11 shows a SEM image of a cross-section of a detail of the wafer of FIG. 10.
Figure 10:
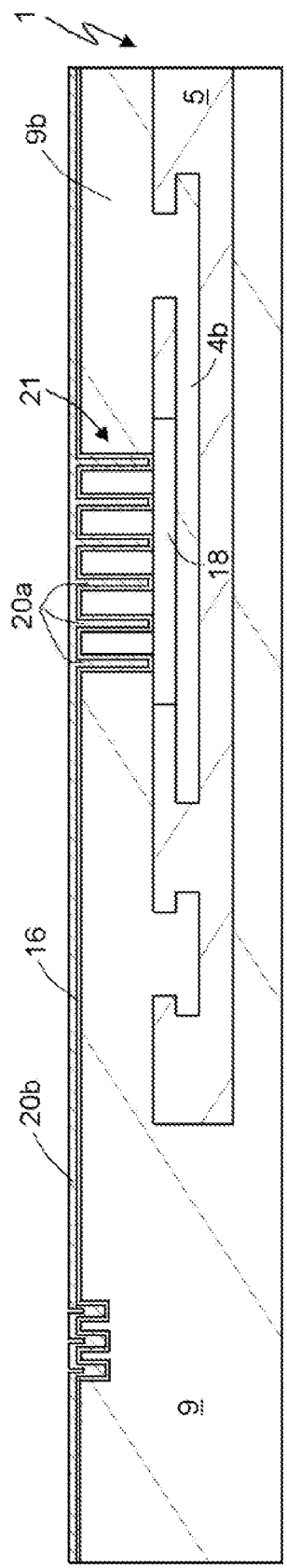

Next (FIG. 10), a polycrystalline silicon layer is deposited, penetrating the apertures 15 and filling them, forming filling regions 20a therein and a polycrystalline layer 20b on the surface of the wafer 1. For example, a layer having a thickness of 0.5-1.5 µm, typically 1.0 µm, may be deposited. In this way, a membrane 21 is formed on top of the cavity 18 and comprises only polycrystalline silicon, including the polycrystalline region 9b, the coating layer 16, and the filling regions 20a. The structure of the membrane 21 is also visible from the SEM image of FIG. 11.

Figure 12:
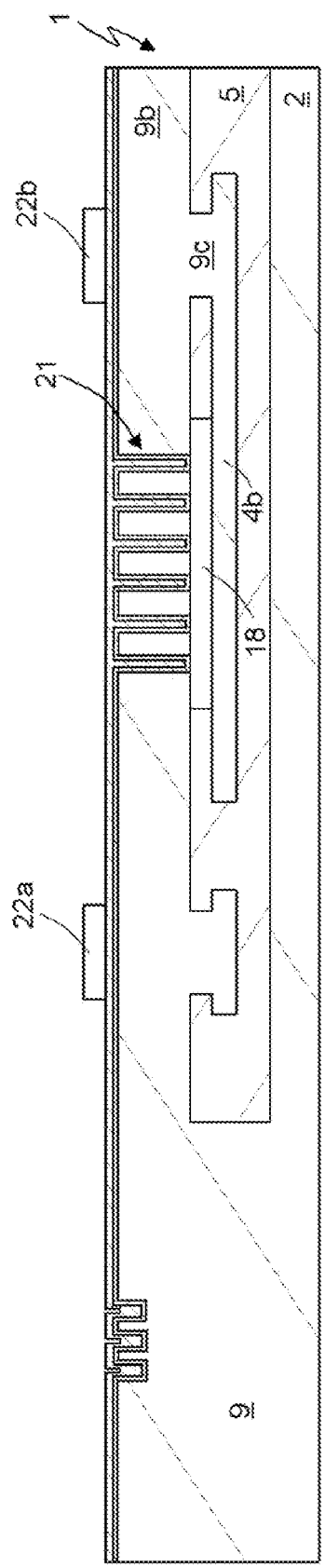
FIG. 12 shows a cross-section of the wafer of FIG. 10, in a subsequent step of the present process.

Next, a first and a second contact 22a, 22b are formed on the surface of the wafer 1, for instance of gold (FIG. 12), and an insulating trench 23 is formed (FIG. 13), via etching and selective removal of the polycrystalline region 9b. In this way, the membrane 21 is electrically decoupled from the rest of the polycrystalline region 9b, and may be electrically biased through an own contact 22a. The contact 22b moreover enables electrical connection of the bottom region 4b through the anchorage portion 9c.

Figure 13:
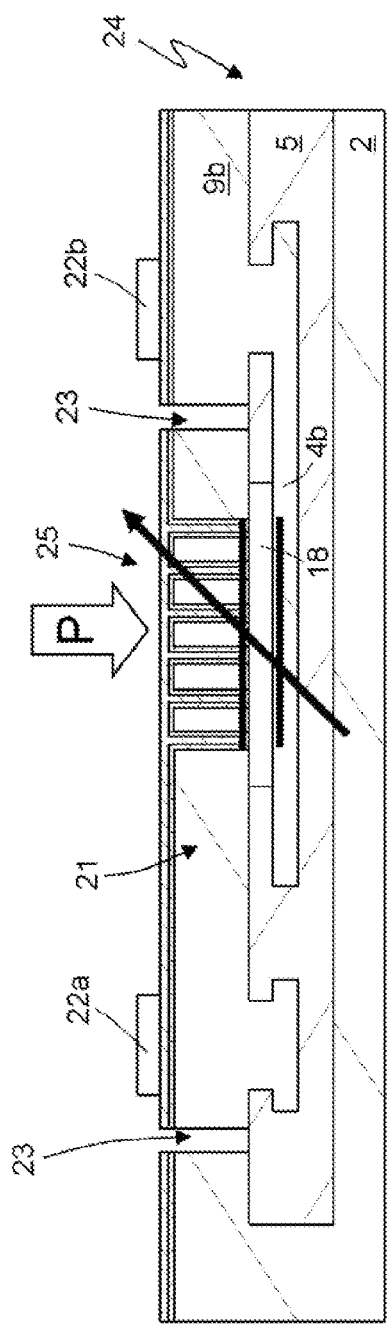
FIG. 13 shows a cross-section of a MEMS device obtained after dicing.

Finally, the wafer 1 is subjected to the usual final machining and dicing steps to obtain individual devices 24, as illustrated in FIG. 13. Here, the membrane 21 forms a variable electrode of a pressure sensor 25, of a capacitive type, the fixed electrode whereof is formed by the bottom region 4b.

The pressure sensor 25 is able to detect a force P acting on the membrane 21. In fact, in the presence of a force P, the membrane 21 bends, modifying the capacitance of the sensor 25. This change of capacitance is then detected, as is known, through the contacts 22a, 22b and processed via known circuitry, not illustrated.

Alternatively, the membrane 21 can be used for forming MEMS devices of different types, such as accelerometers, gyroscopes, resonators, valves, printing heads for ink-jet printers and the like, in which case the structures underneath and/or on top of the membrane 21 are adapted according to the envisaged application.

Likewise, if the MEMS device forms a microfluidic device, having a plurality of cavities/buried channels 18, the dimensions, shape, and number of channels 18 are optimized according to the application, and the MEMS device is completed with the structures and the elements necessary for its operation.

Figure 14:
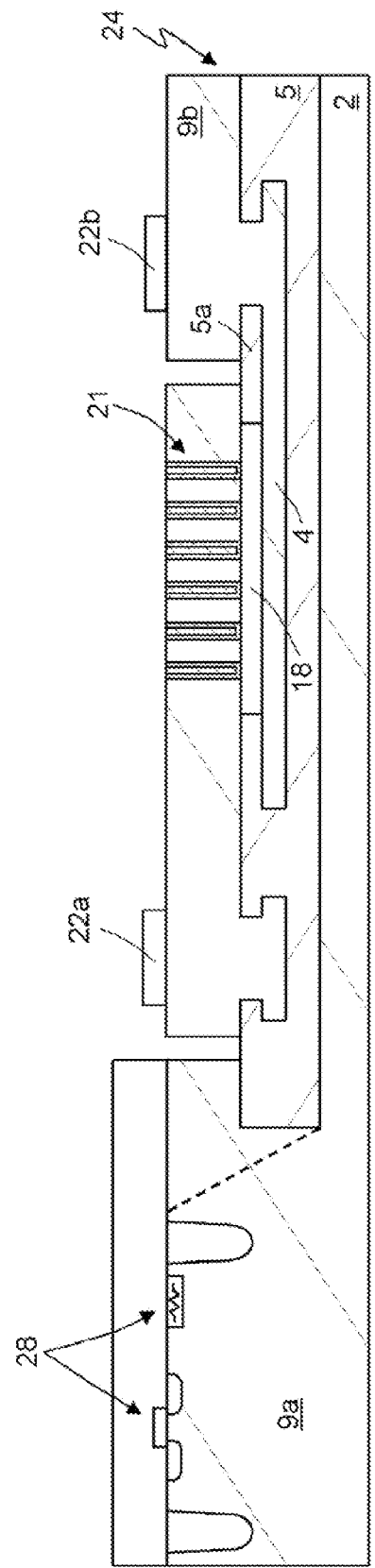
FIG. 14 shows a cross-section of a variant of the MEMS device of FIG. 13.

When it is desired to integrate electronic components in a same wafer 1, this can be done using the monocrystalline region 9a. In this case, before forming the contacts 22a, 22b, the wafer is etched back so as to remove the polycrystalline layer 20b from the surface of the wafer 1. Then the desired components, designated as a whole by 28 in FIG. 14, are integrated.

The process and the device described above have numerous advantages. First of all, the process is simple and uses a reduced number of masking steps. The device can thus be manufactured at low costs.

Thanks to the monolithic structure of the membrane, substantially without empty areas, the membrane is robust and thus particularly suited for obtaining MEMS structures of different types, reducing risks of failure, deformation, or damage that might jeopardize functionality thereof. When just one material (silicon) is used for the polycrystalline region 9b, the coating layer 16, and the filling regions 20a, an even higher robustness of the membrane is achieved, since it has as lower sensitivity to thermal stresses.

The process is simple to implement because it does not present particular critical aspects or execution difficulties, thus guaranteeing high yields and low final costs. In addition, it is particularly flexible in so far as it enables buried cavities 18 and/or membranes 21 to be obtained of the desired shape and dimensions as regards both the surface and the thickness in a simple way. In particular, for the application as pressure sensor, it is possible to obtain a large thickness of the membrane so as to increase the accuracy of the sensor.

Use of porous silicon enables filling of the apertures 15 without any risk of the filling material 20a penetrating into the cavity 18 or even of it being deposited on the bottom thereof, thus guaranteeing that a membrane will be obtained having a regular shape and preventing any undesirable formations that would jeopardize or in any case reduce the electrical/mechanical characteristics of the finished MEMS device.

The buried cavity 18 is hermetically sealed towards the outside world, as desired in some applications.

Finally, modifications and variations may be made to the process and device described and illustrated herein, without thereby departing from the scope of the present disclosure. For example, the epitaxial growth could be performed by depositing a seed layer at least on the sacrificial portion 5a of the dielectric layer 5. In this case, the bottom region 4b could be formed directly by the substrate 2, eliminating the steps for its formation and simplifying the steps for forming the insulating dielectric region 5, above all when the bottom region 4b does not require being insulated from the rest of the pseudo-epitaxial layer 9 and/or from the substrate 2. In addition, the sacrificial portion 5a of the dielectric layer 5 could have a shape and dimensions substantially corresponding to those of the cavity 18 and thus of the desired membrane 21.

If the device 24 is not a capacitive pressure sensor, the material of the bottom region 4b can be any whatsoever, provided that it is different from the material of the sacrificial layer 6; for instance, it may be a dielectric material different from oxide, such as silicon nitride.

The porous silicon layer could be obtained in a different way; for example, it could be transformed into porous only after deposition, in a per se known manner.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process for manufacturing a MEMS device, the process comprising:
    forming an insulating layer on a substrate of semiconductor material;
    after forming the insulating layer, forming a bottom region of a first material;
    forming a sacrificial layer over the bottom region, the sacrificial layer being of a material that is different from the first material;
    forming a sacrificial region, wherein forming the sacrificial region comprises selectively removing part of the insulating layer and part of the sacrificial layer in at least one contact area;
    growing a membrane region of semiconductor material on the sacrificial region, wherein growing the membrane region comprises forming a contact region on the bottom region and a contact portion on top of the contact region and alongside the membrane region;
    forming a plurality of apertures in the membrane region by selectively etching the membrane region as far as the sacrificial region, each aperture having a side wall delimited by the membrane region and a bottom delimited by the sacrificial region;
    completely and conformally coating the side wall and the bottom of the apertures with a porous material layer;
    forming a cavity by selectively removing at least one portion of the sacrificial region through the porous material layer; and
    filling the apertures with filling material.

2. The process according to claim 1, wherein at least one of the filling material, the membrane region, and the porous material layer comprise silicon.

3. The process according to claim 1, wherein each of the apertures has a width/depth ratio of 1:5 to 1:20.

4. The process according to claim 1, wherein forming a plurality of apertures comprises performing a dry or wet etch.

5. A process for manufacturing a MEMS device, the process comprising:
    forming an insulating layer on a substrate of semiconductor material;
    after forming the insulating layer, forming a bottom region of a first material;
    forming a sacrificial layer over the bottom region, wherein the sacrificial layer is of a second material that is different from the first material,
    forming a sacrificial region on the bottom region, wherein forming the sacrificial region comprises selectively removing part of the insulating layer and part of the sacrificial layer in at least one lateral area;
    growing a membrane region of semiconductor material on the sacrificial region, wherein growing the membrane comprises forming a monocrystalline region on the lateral area, and a polycrystalline region on the sacrificial layer, the polycrystalline region being adjacent to the monocrystalline region, and forming the membrane region and a contact portion
    forming a plurality of apertures in the membrane region by selectively etching the membrane region as far as the sacrificial region, each aperture having a side wall delimited by the membrane region and a bottom delimited by the sacrificial region;

completely and conformally coating the side wall and the bottom of the apertures with a porous material layer;

forming a cavity by selectively removing at least one portion of the sacrificial region through the porous material layer; and filling the apertures with filling material.

6. The process according to claim 5, further comprising integrating electronic components in the monocrystalline region.

7. A MEMS device comprising:
a substrate of semiconductor material;
a bottom region;
a first insulating layer on top of the substrate and underneath the bottom region;
a membrane region of semiconductor material; and
a buried cavity arranged between the bottom region and the membrane region, a second insulating layer extending alongside the buried cavity and on the bottom region, wherein the membrane region includes a polycrystalline structure including a plurality of apertures extending through a thickness of the membrane region and conformally coated with a porous material layer along a side wall and a bottom of each aperture, wherein the apertures are filled with filling material.

8. The MEMS device according to claim 7, wherein at least one the membrane region, the filling material, and the porous material layer comprise silicon.

9. The MEMS device according to claim 7, wherein the bottom region is of polycrystalline silicon.

10. The MEMS device according to claim 7, wherein each aperture has a width/depth ratio of 1:5 to 1:20.

11. The MEMS device according to claim 7, wherein the device is one of: a pressure sensor; an accelerometer; a gyroscope; a resonator; a transducer; a valve; an ink jet printing head; and a microfluidic device.

12. A MEMS device comprising:
a bottom region;
a membrane region of semiconductor material;
a buried cavity arranged between the bottom region and the membrane region, wherein the membrane region includes a polycrystalline structure including a plurality of apertures extending through a thickness of the membrane region and conformally coated with a porous material layer along a side wall and a bottom of each aperture, wherein the plurality of apertures are filled with filling material; and
a monocrystalline region extending alongside the bottom region, the buried cavity, and the membrane region.

13. The MEMS device according to claim 12, further comprising electronic components integrated in the monocrystalline region.

14. The MEMS device according to claim 12, wherein at least one of the membrane region, the filling material, and the porous material layer comprise silicon.

15. A pressure sensor comprising;
an interface circuit configured to detect capacitance changes and to output an electrical quantity; and
a MEMS device coupled to the interface circuit and including:
a bottom region;
a monocrystalline region underlying the bottom region;
electronic components integrated in the monocrystalline region;
a membrane region of semiconductor material; and
a buried cavity arranged between the bottom region and the membrane region, wherein:
the membrane region includes a polycrystalline structure including a plurality of apertures extending through a thickness of the membrane region and conformally coated with a porous material layer along a side wall and a bottom of each aperture, the apertures are filled with filling material.

16. The pressure sensor in claim 15, wherein at least one the membrane region, the filling material, and the porous material layer of the MEMS device comprise silicon.

17. A pressure sensor comprising:
an interface circuit configured to detect capacitance changes and to output an electrical quantity; and
a MEMS device coupled to the interface circuit and including:
a substrate of semiconductor material;
a bottom region;
a first insulating layer on top of the substrate and underneath the bottom region;
a membrane region of semiconductor material;
a buried cavity arranged between the bottom region and the membrane region, wherein the membrane region includes a polycrystalline structure including a plurality of apertures extending through a thickness of the membrane region and conformally coated with a porous material layer along a side wall and a bottom of each aperture, wherein the apertures are filled with filling material; and
a second insulating layer extending alongside the buried cavity and on the bottom region.

18. The pressure sensor according to claim 17, wherein at least one of the membrane region, the filling material, and the porous material layer comprise silicon.

19. A pressure sensor comprising:
an interface circuit configured to detect capacitance changes and to output an electrical quantity; and
a MEMS device coupled to the interface circuit and including:
a bottom region;
a membrane region of semiconductor material; and
a buried cavity arranged between the bottom region and the membrane region, wherein the membrane region includes a polycrystalline structure including a plurality of apertures extending through a thickness of the membrane region and conformally coated with a porous material layer along a side wall and a bottom of each aperture, wherein the apertures are filled with filling material, and
a monocrystalline region extending alongside the bottom region, the buried cavity, and the membrane region.

20. The pressure sensor according to claim 19, herein each aperture has a width/depth ratio of 1:5 to 1:20.

* * * * *